(12) United States Patent  
Raftery et al.

(10) Patent No.: US 7,187,173 B1
(45) Date of Patent: Mar. 6, 2007

(54) MULTI-COIL NMR PROBE WITH NONMAGNETIC DIODES

(75) Inventors: Daniel Raftery, West Lafayette, IN (US); Robert E. Santini, West Lafayette, IN (US); Megan A. Macnaughtan, Athens, GA (US)

(73) Assignee: Purdue Research Foundation, West Lafayette, IN (US)

( * ) Notice: Subject to any disclaimer, the term of this patent is extended or adjusted under 35 U.S.C. 154(b) by 31 days.

(21) Appl. No.: 10/825,856

(22) Filed: Apr. 15, 2004

Related U.S. Application Data (60) Provisional application No. 60/463,146, filed on Apr. 15, 2003.

(51) Int. Cl.
 *G01V 3/00* (2006.01)

(52) U.S. Cl. ...................... 324/318; 324/319
(58) Field of Classification Search ................ 324/318, 324/319, 321, 322, 309, 307, 300; 600/410, 600/420, 422
 See application file for complete search history.

(56) References Cited

U.S. PATENT DOCUMENTS

| | | |
|---|---|---|
| 5,092,973 A | 3/1992 | Zare et al. |
| 5,141,609 A | 8/1992 | Sweedler et al. |
| 5,318,680 A | 6/1994 | Fishman et al. |
| 5,334,937 A | 8/1994 | Peck et al. |
| 5,654,636 A | 8/1997 | Sweedler et al. |
| 5,684,401 A | 11/1997 | Peck et al. |
| 6,097,188 A | 8/2000 | Sweedler et al. |
| 6,456,072 B1 | 9/2002 | Webb et al. |
| 6,696,838 B2 | 2/2004 | Raftery et al. |
| 6,700,379 B2 | 3/2004 | Peck et al. |
| 6,888,351 B2 * | 5/2005 | Belt et al. .................... 324/318 |
| 6,958,609 B2 * | 10/2005 | Raftery et al. .............. 324/321 |
| 2002/0149369 A1 | 10/2002 | Peck et al. |
| 2002/0155033 A1 | 10/2002 | Strand et al. |
| 2002/0176804 A1 | 11/2002 | Strand et al. |
| 2003/0136679 A1 | 7/2003 | Bohn et al. |

OTHER PUBLICATIONS

Macnaughtan et al; NMR Difference Probe; Journal of Magnetic Resonance 156; 97-103 (2002).*
Koga et al; Phygical Review Letters; vol. 88, Mar. 25, 2002.*
Lebedeva et al Journal of Applied Physics vol. 93, Jun. 13, 2003.*
Wu et al., "$^1$H-NMR Spectroscopy on the Nanoliter Scale for Static and On-Line Measurements," *Anal. Chem.*, vol. 66, No. 22, Nov. 15, 1994, pp. 3849-3857.
Olson et al., "High-Resolution Microcoil $^1$H-NMR for Mass-Limited, Nanoliter-Volume Samples," *Science*, vol. 270, Dec. 22, 1995, pp. 1967-1970.
Hou et al., "NMR Analysis of Multiple Samples Using Parallel Coils: Improved Performance Using Reference Deconvolution and Multidimensional Methods," *Analytica Chimica Acta*, vol. 20174, 1999, pp. 1-9.
Li et al., "Multiple Solenoidal Microcoil Probes for High-Sensitivity, High-Throughput Nuclear Magnetic Resonance Spectroscopy," *Anal. Chem.*, vol. 71, No. 21, Nov. 1, 1999, pp. 4815-4820.
Ting Hou et al., "Analysis of Multiple Samples Using Multiplex Sample NMR: Selective Excitation and Chemical Shift Imaging Approaches" *Anal Chem.*, vol. 73, No. 11, Jun. 1, 2001, pp. 2541-2546.

\* cited by examiner

*Primary Examiner*—Brij B. Shrivastav
(74) *Attorney, Agent, or Firm*—William F. Bahret (57) ABSTRACT

A multi-coil NMR probe using nonmagnetic diodes as switches located in close proximity to the radio-frequency circuit of the sample coils within the probe.

10 Claims, 8 Drawing Sheets

To resonant circuit

MULTI-COIL NMR PROBE WITH NONMAGNETIC DIODES

CROSS-REFERENCE TO RELATED APPLICATION

This application claims the benefit of U.S. Provisional Patent Application Ser. No. 60/463,146, filed Apr. 15, 2003, which application is hereby incorporated by reference along with all references cited therein.

GOVERNMENT RIGHTS

This invention was made with government support under Contract/Grant No. CHE 95-31693 awarded by the National Science Foundation. The government has certain rights in the invention.

BACKGROUND OF THE INVENTION

Nuclear magnetic resonance spectroscopy (NMR) is a powerful analytical tool due to its unique capabilities in structure determination and intermolecular interaction detection as well as its non-destructive and quantitative nature. NMR is routinely used in biomedical and synthetic applications; in particular, pharmaceutical drug discovery programs, combinatorial library analysis, and clinical analysis. With the adoption of combinatorial chemistry methods, large numbers of new compounds are being synthesized for areas such as pharmaceutical research, organic synthesis, and catalysis discovery. Large libraries of potential drug lead compounds are screened with NMR techniques in search of interactions with target protein molecules. As more libraries are produced with combinatorial reactions, the demand for high-throughput analysis increases. While NMR is well suited for the analysis of combinatorial libraries, clinical and a variety of other samples, the throughput of NMR is limiting.

Current approaches to high-throughput NMR use automatic sample changers or flow probes with robotic liquid handlers. Automatic sample changers are limited by a relatively high failure rate mainly due to the use of glass NMR tubes, which can break and also vary enough that automatic routines such as spinning the sample and finding the $^2$H lock can fail. Flow probe automation systems are reported to be more reliable. Typically these systems use a flow-through probe design with sample cells aligned parallel to the magnetic field. These probes use saddle-shaped Helmholtz coils with sample volumes ranging from 100–480 µL and active volumes ranging from 40–250 µL. Another approach to NMR flow probe design is the development of microcoil NMR probes. The microcoil flow probe has been used with several hyphenated techniques, such as microbore HPLC-NMR and capillary electrophoresis (CE)-NMR, and was reviewed recently. The advantage of using a microcoil probe is that less sample volume is needed (1 nL–10 µL) and the mass sensitivity ($S_m$, signal-to-noise ratio (S/N) per µmol of analyte) is high. This makes the system ideal for use with samples that are only available in small volumes such as natural product libraries or synthetic combinatorial compounds.

Microcoils provide another avenue to increase NMR throughput via parallel NMR detection. Multiple solenoidal microcoils can be stacked along the magnetic field axis in a single NMR probe because they are aligned perpendicular to the magnetic field and, unlike saddle-shaped Helmholtz coils, the solenoidal microcoils are small enough to fit multiple coils in one probe. Parallel analysis is common in other analytical techniques, but has only recently been explored for NMR. Various approaches have been attempted, including isolated circuits, rapid selective sample excitation, and imaging methods. Depending on the approach used, the relative signal-to-noise ratio (S/N) of each coils, compared to a single coil, in the multi-coil configuration is an important consideration. With isolated circuits, the relative S/N is not degraded except through cross-talk; however, with parallel circuits the S/N of a coil is reduced by a factor of $n^{1/2}$, where n is the number of coils. We previously introduced the multi-coil multiplex NMR probe for parallel NMR analysis, which is capable of analyzing four samples at a time using chemical shift imaging or in rapid succession, with a selective excitation approach. Sample loading/unloading and data acquisition can be automated using parallel coil NMR probes to achieve truly high-throughput NMR analysis. However, the development of novel approaches to highly parallel NMR probes for higher throughput operation is an important goal.

SUMMARY OF THE INVENTION

The present invention provides a multi-coil NMR probe using nonmagnetic diodes as switches located proximate the radio-frequency circuit of the sample coils within the probe. The nonmagnetic diodes permit the probe to function as a high-resolution NMR device and promote high-throughput NMR.

The objects and advantages of the present invention will be more apparent upon reading the following detailed description in conjunction with the accompanying drawings.

DETAILED DESCRIPTION OF PREFERRED EMBODIMENTS

For the purpose of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device and such further applications of the principles of the invention as illustrated therein being contemplated as would normally occur to one skilled in the art to which the invention relates.

Figure 1:
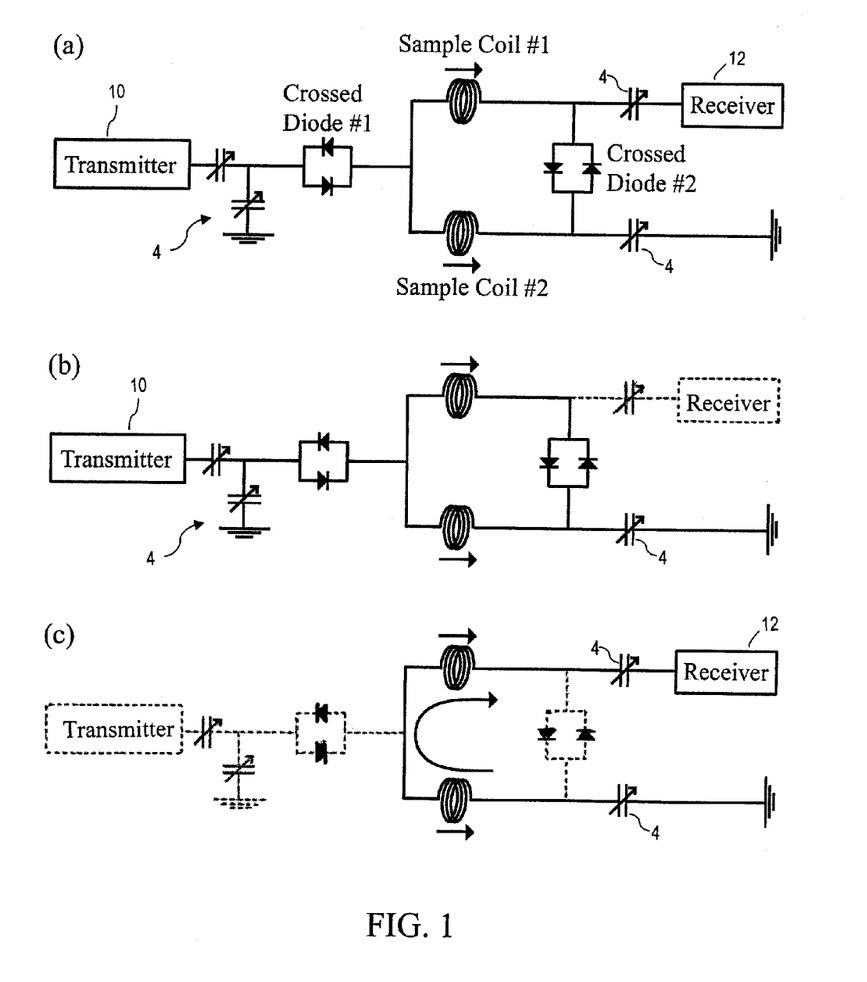
FIG. 1 is a schematic diagram of one embodiment of a resonant circuit for use with a multi-coil NMR probe according to the present invention.

One embodiment of a multi-coil NMR probe according to the present invention is an NMR difference probe containing a resonant circuit that uses crossed diodes, preferably nonmagnetic diodes as described below, to switch the circuit between parallel excitation of two samples and serial acquisition of the resulting NMR signals. The circuit allows for direct acquisition of a difference spectrum of two samples with a π/2 pulse-acquire sequence. For example, FIG. 1 illustrates the use of crossed diodes (#1 and #2) as switches in a resonant circuit which thereby acts as two distinct circuits during transmission and acquisition. During the transmission of the pulse from the transmitter 10, both crossed-diodes are passively switched on and the sample coils are connected in parallel such that both samples receive the same phase excitation pulse. As depicted in FIG. 1b, the resulting transverse magnetizations point along the same direction after the pulse. Crossed-diode #2 ensures that both coils are grounded when a radio frequency pulse is active. The resonant circuit changes during data acquisition because the received signal is small (μvolts) and the crossed-diodes are not activated. As seen from the receiver, the coils are connected in series and crossed-diode #1 isolates the signal from the transmitter tuning circuit (see FIG. 1c). With respect to the receiver, the transverse magnetizations induce voltages in each coil that are oriented in opposite directions and, therefore, add with opposite phase to give a difference spectrum. The acquired data contain signals from both samples, but due to the effects of parallel excitation and serial acquisition, the signals from the two coils are 180 degrees out-of-phase and, consequently, common signals cancel.

Figure 2:
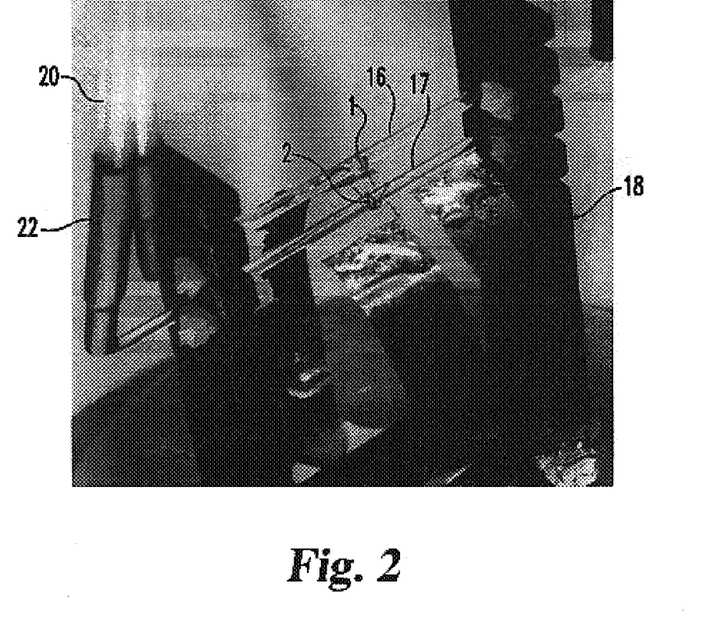
FIG. 2 shows the head portion of one embodiment of a multi-coil NMR probe according to the present invention.

One example of such an NMR difference probe circuit was constructed using a home-built, wide-bore (73 mm) probe body. The probehead, shown in FIG. 2, consists of two solenoid microcoils 1 and 2 fabricated by wrapping polyurethane coated high purity (99.99%) 42-gauge (63.5 μm diameter) copper wire (California Fine Wire Co., Grover Beach, Calif.) around glass capillaries 16 and 17 (860 μm o.d., 400 μm i.d.). Further description of microcoil construction may be found in U.S. Pat. No. 6,696,838, issued Feb. 24, 2004, hereby incorporated by reference, and in references cited therein. The microcoils are attached to the capillary tubes using a cyanoacrylate adhesive (Krazy Glue, Borden Inc., Columbus, Ohio). Each coil consists of 3 turns and has an inner diameter of 860 μm and a length of 200 μm. The sample capillaries are mounted on a rectangular support 18 made of black Delrin, which holds the capillary tubes at an inter-coil spacing (center to center) of 3 mm. To allow for flow introduction of the samples, Teflon tubing 20 (Small Parts Inc., Miami Shores, Fla.) is attached to the ends of the capillaries with polyolefin heat-shrink tubing 22 (Small Parts Inc., Miami Shores, Fla.). The sample coils and holder are housed in a removable PVC container filled with Fluorinert FC-43 (Syn Quest Laboratories, Alachua, Fla.), a magnetic susceptibility matching fluid shown to improve spectral linewidth.

Referring back to FIG. 1, the NMR difference probe circuit contains the two sample coils #1 and #2, four nonmagnetic tunable capacitors 4 (Voltronics, Denville, N.J.), and two sets of crossed-diodes #1 and #2 constructed from 1N914 PIN diode dice (Semi Dice, South Easton, Mass.). The resonant circuit is mounted on top of the probe body with two semi-rigid copper coaxial lines connecting the circuit to two BNC connectors at the base of the probe. The variable capacitors and crossed-diodes were placed below the probehead to minimize magnetic susceptibility mismatching effects.

The diodes are preferably nonmagnetic diode dice. Commercially available wire lead or surface mount diodes are preferably not used near the sample coils because they have nickel-coated wires and/or contacts, which are paramagnetic. It has been found to be important to use nonmagnetic diodes to enable miniature multi-coil probes to function as high resolution NMR devices. The diodes are preferably fabricated on a completely nonmagnetic substrate consisting of a set of gold-coated ceramic pads on a solderable platform. One side of the diode die is adhered to the gold pad with conductive silver epoxy. Microscopic aluminum or gold wires are used to connect the diodes to the gold pad, to cross the non-conducting boundary between the gold pads, and to connect the gold pads to a nonmagnetic platform. The entire miniature assembly (diodes, gold pads, and microscopic wires) is encapsulated in a nonmagnetic polymer.

Figure 3:
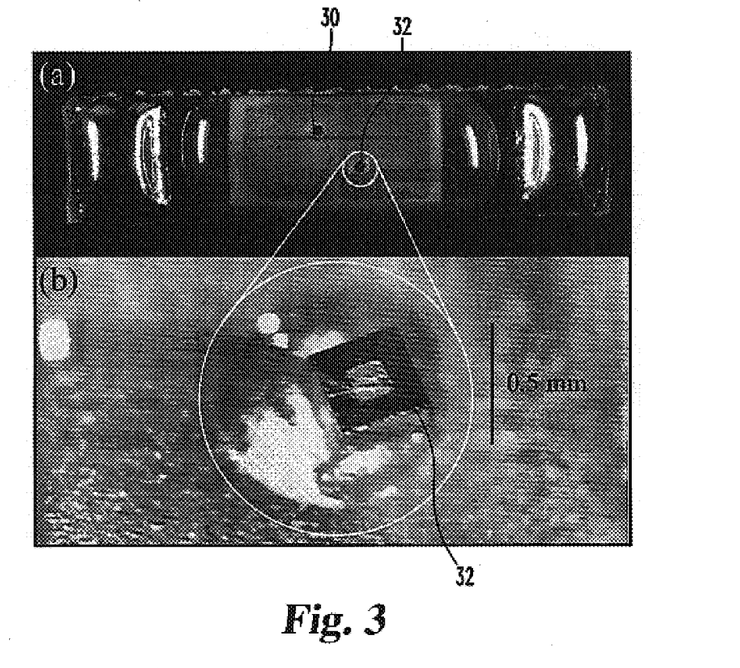
FIG. 3 is a photograph of a nonmagnetic crossed-diode pair for use in a resonant circuit such as shown in FIG. 1.

More specifically, with reference to FIG. 3, suitable crossed diodes were made by attaching 1N914 diode dice 30 and 32 to a gold film on a ceramic substrate ($Al_2O_3$) with conductive silver epoxy (Epoxy Technology Inc., Billerica, Mass.) (see FIG. 3). Ultrasonic wire bonding with 0.001 inch diameter aluminum wire was used to make electrical connections between the top of the diode dice and the gold sections. The gold pads were epoxied to FR-4 circuit board with 5 minute epoxy (Devcon, Danvers, Mass.), and 0.001 inch diameter aluminum wire was used to make electrical connections between the gold film and the copper layer of the circuit board. A protective coating of Syl-Gard (Dow Corning, Midland, Mich.) was applied over the diode dice and aluminum wires, and 60/40 rosin core solder was applied to the ends of the circuit board for connection into the resonant circuit.

The above-described NMR probe can obtain a difference spectrum directly through the hardware. In particular, by using crossed diodes as switches in the resonant circuit of the dual-coil probe, the parallel excitation of two samples and the serial acquisition of the NMR signals give a spectrum where the signals from the two samples are subtracted. No software manipulation, pulse sequence modification, or spectrometer alteration is necessary to obtain the difference spectrum and suppress common signals. The technique does not lengthen the pulse sequence and reduces experimental time, compared to other NMR difference experiments, since a difference spectrum is automatically collected and no post-processing subtraction is needed. Additional advantages of an NMR difference probe as described above are described in a paper by Megan Macnaughtan et al. entitled "NMR Difference Probe: A Dual-Coil Probe for NMR Difference Spectroscopy," *Journal of Magnetic Resonance* 156, 97–103 (2002), hereby incorporated by reference.

Figure 4:
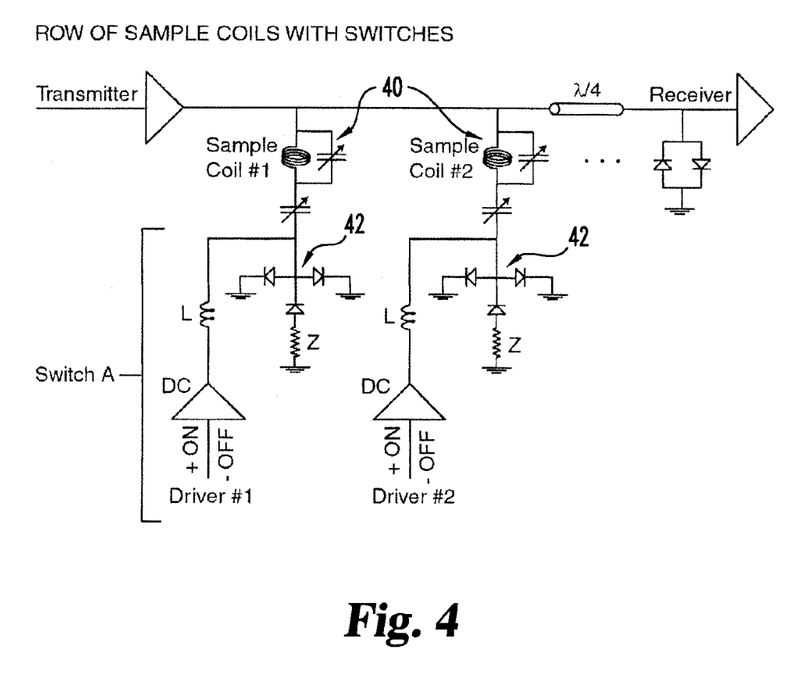
FIG. 4 is a schematic diagram of one embodiment of a switched coil array according to the present invention.

Another aspect of the present invention involves highly parallel NMR probes which employ a switched array of resonant coils. Two embodiments of such a switched array for a multi-coil NMR probe are disclosed herein: a "linear diode switched array" shown in FIG. 4, and a "diode crossbar array" shown in FIG. 5. In the first configuration, the circuit has a linear array of resonant circuits 40 wired in parallel. Each resonant circuit is connected to a radio-frequency ground plane through a diode switch circuit (Switch A). This switch either grounds the NMR sample coil to make that coil active for exciting and detecting the desired sample, or makes that coil inactive by spoiling the Q (or shifting the resonance frequency) via a connection to impedance Z. Active switching is achieved via a DC current source. The current source functions to forward bias the two PIN diodes 42 connected in parallel to ground to activate a given coil. The PIN diodes are chosen for low on-impedance. The Q-spoiling impedance, Z, exists in series with the coil circuit when the DC current source is off. Activation of impedance Z can also be used to temporarily shift the frequency of undesired coils so as to decouple them from the observe coil. The active diode switching circuit is useful for multiplexing n coils for high throughput. The transmitter may be connected to each coil individually in an addressable fashion, such that an adequate signal-to-noise (S/N) ratio is maintained regardless of how many coils are connected.

Figure 5:
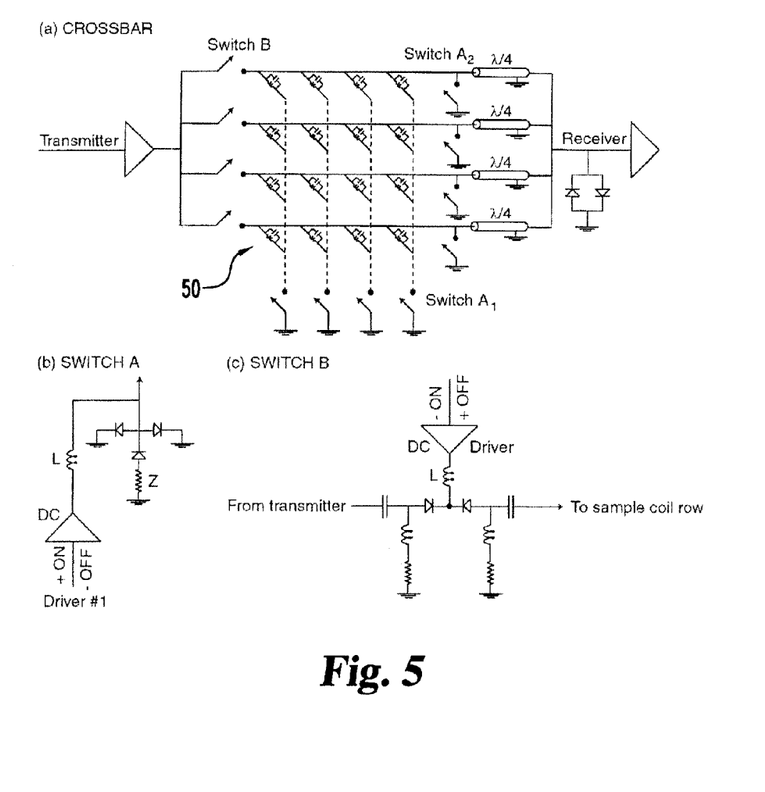
FIG. 5 is a schematic diagram of another embodiment of a switched coil array according to the present invention.

It becomes effective to create an X-Y array if eight or more NMR coils are required. Referring to FIG. 5, the transmitter is switched between several rows of resonant sample coil circuits 50 in this configuration. This circuit topology reduces the required number of nodes in the array and thus the number of radio-frequency switches and drivers. As few as a single sample coil (which connects the horizontal and vertical lines at each intersection of the crossbar array) is active at one time, since one switch (B) chooses the row of circuits that the transmitter addresses through the tops of the resonant circuits, another switch ($A_1$) chooses which column of coils is grounded during transmission and reception, and the last switch ($A_2$) isolates the row of coils that the receiver addresses. As in the linear diode switched array circuit, all coils in an activated row are Q spoiled by series high impedances Z when non-activated (switch $A_1$). Switches B act as high impedance to the transmitter output when a positive voltage is applied to the two diodes (+OFF position), or allow the transmitter to pass current through the two diodes when the logic driver voltage is negative (−ON). The switches A may be configured as shown in FIG. 5$b$. As shown in FIG. 5$a$, inductors, capacitors, and resistors in switch B are added to control the total load impedance at the transmitter output and the DC and radio-frequency current paths. NMR coils can be addressed individually (random access) or in groups (columns or rows) in this array.

The isolation of each coil circuit provided by this crossbar arrangement ensures that the S/N is preserved. The NMR coils and associated circuit components may be manufactured using microcircuit fabrication techniques such that tuning and matching elements will be "pre-trimmed" in production on a circuit substrate to optimize the coil tuning for a given sample dielectric constant.

The new switched array approach does not suffer from the S/N degradation of parallel multiplexed coils. Each coil circuit is activated individually with a digitally controlled voltage, and the diode-switches detune and/or Q-spoil all of the other coils at the same time. By isolating one coil, the S/N produced by that coil is not degraded by noise from the other coils. The disclosed switched array approach has the following advantages among others: 1) improved S/N, 2) better isolation between coils, 3) individual or group detection, and 4) simplified experimental procedures for data acquisition compared to methods involving gradients. We may be able to place the detection coils closer together to increase the parallelism. This approach makes it possible to realize large addressable arrays of NMR coils in a single probe that can be randomly addressed.

A variety of applications can be envisioned for this highly parallel probe. These include the rapid analysis of multiple samples such as those synthesized in combinatorial chemical libraries. Clinical sample analysis will also benefit from decreased measurement time and high throughput. LC/NMR can benefit from the adaptation of multiple, parallel LC analyses. Faster one-dimensional and multi-dimensional NMR experiments on single samples split into multiple coils by rapid, sequential excitation of individual coils with the advantage of a reduced delay between transients compared to single coil experiment or by detecting groups of coils simultaneously for improved S/N. In addition, as we have shown, spectral differences can be measured between two or more samples by subtracting the signals from different detection coils. Finally, the nonmagnetic diodes can be made with various diode types and can be used for a variety of radio-frequency switching applications.

Figure 6:
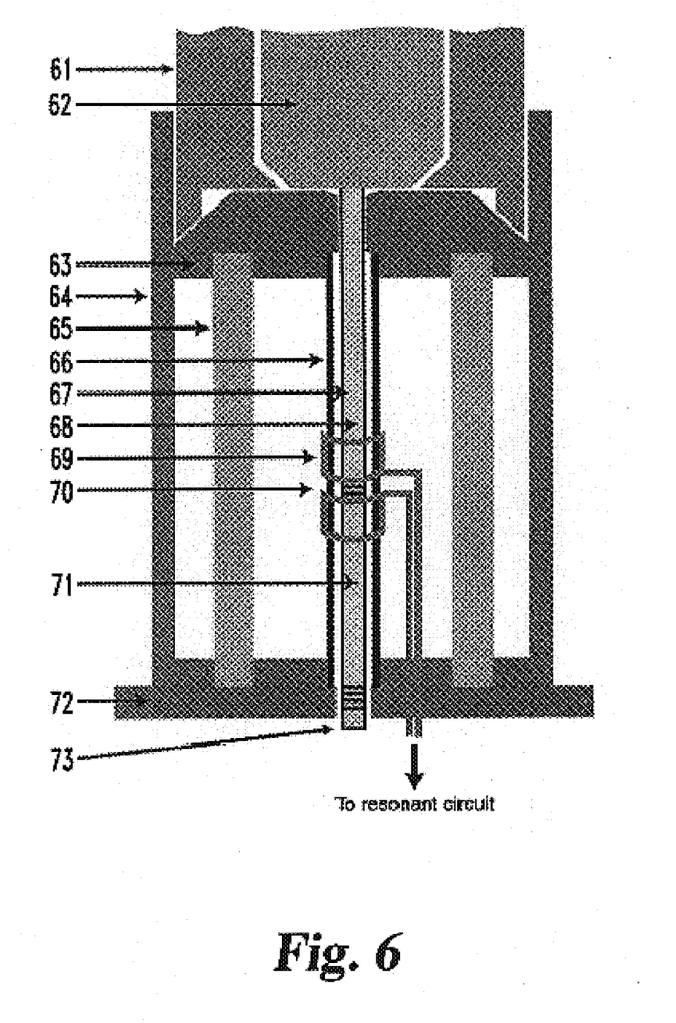
FIG. 6 is a drawing of a portion of another embodiment of a multi-coil NMR probe according to the present invention.
Figure 7:
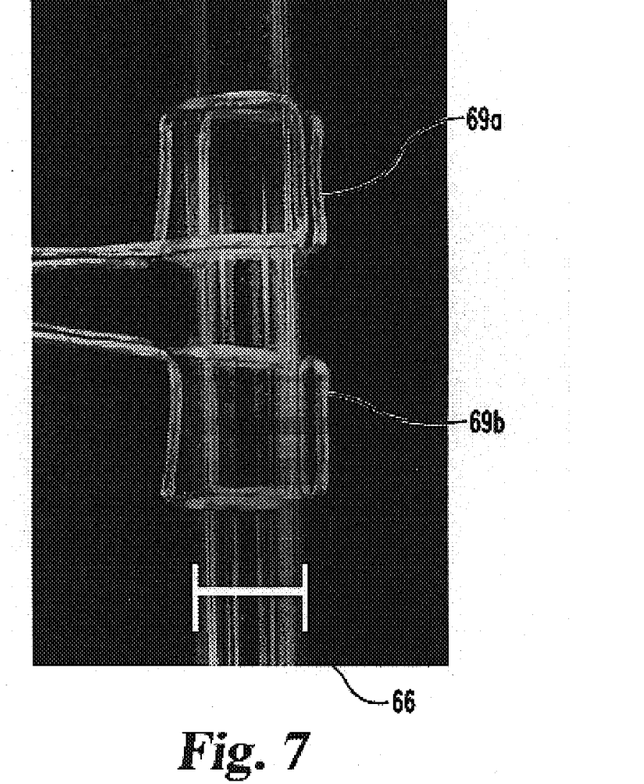
FIG. 7 is a close-up view of a dual saddle-coil for use in the probe of FIG. 6.

Referring now to FIGS. 6 and 7, another embodiment of a multi-coil NMR probe according to the present invention is a dual saddle-coil NMR difference probe. As with the first embodiment described above, crossed diodes are used to switch the circuit pathway passively, and consequently, the relative phase of the coils during the NMR experiment. Only one free induction decay is collected and Fourier transformed to give a difference spectrum consisting of signal from both samples that are 180° out-of-phase with respect to each other. The saddle-coil difference probe has two saddle-shaped Helmholtz coils 69$a,b$ that excite and detect two samples placed in a 3 mm, vertically aligned NMR tube. Compared to the microcoil difference probe, the saddle coil probe has some additional features to improve the performance of NMR difference experiments on protein-ligand systems. These enhancements include a larger sample detection volume, lower limit of detection, sample-spinning capabilities, and an axial pulsed field gradient.

The resonant circuit may be the same as described above with respect to FIG. 1, including the nonmagnetic crossed diodes used to switch the circuit passively for parallel excitation and serial acquisition. That is, during excitation, the saddle coils are connected in parallel with respect to the transmitter. However, during detection, the NMR signal voltage produced by the samples is small enough that the crossed-diodes are not active and do not allow current to flow. The circuit pathway changes such that the saddle coils are connected in series with respect to the receiver. The parallel excitation and serial detection creates a phase difference of 180° between the signals from each coil, resulting in the generation of an automatic difference between the signals through the circuit hardware. The difference signals are collected into one free induction decay that is digitally stored and Fourier transformed to give a difference spectrum of the two samples.

The dual-saddle NMR difference probe was built for a 300 MHz, wide bore (73 mm) magnet. The top of the probe contains the difference circuit with the saddle coils 69, the pulse field gradient coils 65, and the hardware to support the coils and allow for sample spinning, as shown in FIG. 6. The difference circuit is connected to the transmitter and receiver of the spectrometer through coaxial cables and BNC connectors at the base of the probe. The actively shielded pulsed field gradient coils were made in-house and consisted of two oppositely wound coils each supported by a cylinder 64 made of Delrin plastic. The gradient coil design and construction has been described previously (Ting Hou et al., (2001) *Anal Chem* 73:2541–2546, hereby incorporated by reference). The saddle coils were constructed from 0.534 mm diameter, zero-magnetic susceptibility Cu—Al NMR coil wire (Doty Scientific, Inc., Columbia, S.C., USA). Aluminum forms were used to make the basic, flat Helmholtz coil shape with 5 mm by 5 mm squares, and then the coils were hand-formed into the saddle coil shape around a 5 mm glass tube (see FIG. 7). As viewed in FIG. 7, each coil follows a counter-clockwise path on the front and back of glass tube 66. For example, the wire forming saddle coil 69a crosses the front of the glass tube from left to right, extends upwardly on the right side of the tube, crosses back across the front of the tube, and then extends downwardly on the left side of the tube. The wire then crosses behind the tube from left to right, extends upwardly on the right side thereof, returns across the back side thereof, and then extends downwardly on the left side thereof to the level of the entry point. As shown in FIG. 6, the 5 mm glass support tube 66 was held in place inside the top of the probe by two disks 63 and 72 and a connecting cylinder 64 made from Delrin plastic. The coils were rigid enough that no glue was needed to hold the coils against the 5 mm glass tube; however to prevent the coils from sliding down the 5 mm glass tube, the coils leads were drawn through a hole in the bottom Delrin disk and glued in place with 5-minute epoxy (Devcon, Danvers, Mass., USA). The rest of the difference circuit including four variable tuning and matching capacitors (Voltronics, Denville, N.J., USA) and the two nonmagnetic crossed-diodes were placed immediately underneath the bottom Delrin disk 72.

The difference probe was designed to allow a 3 mm sample NMR tube 67 to be inserted into the probe using the traditional, air-supported drop from the top of the magnet through the upper barrel 61 with a spinner turbine 62. The top Delrin disk 63 of the difference probe has a 4 mm hole through the concentric center and holds the 5 mm support tube 66 in place to receive the sample. The upper barrel sits on the top Delrin disk inside the Delrin cylinder of the difference probe (see FIG. 2). The 3 mm NMR tube 67 is inserted into the 5 mm support tube 66 and can be spun at 20 Hz using the normal software options.

The difference probe is designed to analyze two samples simultaneously, so a 3 mm NMR tube (Wilmad-Labglass, Buena, N.J., USA) was modified to hold two samples 68 and 71. The sealed end of the tube was cut and a small cylinder 73 (3 mm long) of Ultem plastic was positioned inside the bottom of the tube. The cylinder was threaded and a matching Ultem screw was machined to provide a liquid-tight seal. A 0.5 mm disk 70 of Ultem was inserted inside the 3 mm NMR tube at 61 mm from the bottom of the tube and was used to isolate the samples. All of the Ultem parts were made using Doty magnetic susceptibility matching plugs (Wilmad-Labglass, Buena, N.J., USA). The bottom sample was loaded into the tube first by inverting the tube. After the tube is sealed with the Ultem screw, the top sample was loaded. An unmodified 3 mm Varian spinner turbine was used to insert the samples into the difference probe and to spin the samples. The Ultem disk that separates the samples is positioned so that it sits in between the two saddle coils of the difference probe (see FIG. 2).

Important factors for optimizing the difference spectrum and improving the cancellation factor are matching the lineshape and frequency axes of the two coils. Both factors involve shimming to improve the homogeneity of the static magnetic field around the two samples and coils in the probe. As is well known in NMR, a homogeneous field will produce a narrow NMR line, thus improving resolution and sensitivity. Therefore, a narrow line is favorable, but with two coils inside one NMR probe, there are other factors for which the shims have to compensate. Namely, matching the magnetic field strength or frequency axis of each coil and obtaining identical, narrow lineshapes for both samples simultaneously. The frequency axes of each coil are matched using the z1 shim, which produces a compensating linear gradient across the coils. The lineshape produced by each coil is improved and matched using the other shims. While each coil can currently be shimmed individually to a linewidth at half-height of 0.25 Hz, the individual optimum set of shim values must be compromised to shim both coils simultaneously.

Since shimming the two samples in the difference probe requires a compromise between the optimal values for each of the coils, other methods for improving the cancellation factor were explored. The coils themselves are hand formed and imperfect in shape. Coils that are identical with a clean saddle shape would improve the lineshape and symmetry with respect to the shims. Zero magnetic susceptibility wire and $D_2O$ susceptibility matched Ultem plastic were used to avoid magnetic susceptibility transitions around the coil and samples, which would otherwise distort the magnetic field. The wire is composed of a copper shell surrounding an inner aluminum core. The copper is not coated and is subject to oxidation, which alters its zero susceptibility value.

The saddle coil difference probe has several advantageous features that differ from the solenoidal microcoil difference probe. The saddle coils themselves detect a larger volume (25 μL) than the solenoidal microcoils (72 nL). With a larger volume, the concentration limit of detection (4 mM $^1H$, one scan) is a factor of 10 better than the microcoil difference probe. The sensitivity of the saddle coil difference probe could be improved further by utilizing a better filling factor (sample volume/coil volume). Using the 5 mm support tube for the coils and the 3 mm NMR sample tube (2.42 mm i.d.), the filling factor is only about 23%. If the 5 mm coil support tube could be replaced with a device that supports the coil from the outer circumference, a larger sample tube could be inserted inside the coils. This system would improve the filling factor and increase the amount of sample detected. Another difference compared to the microcoil probe is that the saddle coils allow a sample or a dual-sample tube to be injected into the probe using the spectrometer's upper barrel and turbine. Even more importantly, the sample can be spun to reduce the effects of equatorial static magnetic field inhomogeneities. The saddle coil difference probe is also equipped with a pair of actively shielded pulsed field gradient coils that can produce an axial magnetic field gradient. The gradient is used in gradient shimming protocols for automated axial shimming and can be used in experiments such those involving diffusion.

The disclosed difference probe is useful for drug screening among other applications. To demonstrate its capabilities, a relaxation-edited difference experiment was performed to examine interactions between glutathione or serine with the glutathione S-transferase, AtGSTU19, an enzyme known to bind glutathione. Methanol, acetonitrile (Mallinckrodt Laboratory Chemicals, Phillipsburg, N.J., USA), ethanol (Pharmco Products, Inc., Brookfield, Conn., USA), and $D_2O$ (99.9% D, Cambridge Isotope Laboratories, Inc., Andover, Mass., USA) were used to make standard samples for testing the difference probe. The relaxation-edited difference experiments were performed using recombinant glutathione S-transferase AtGSTU19 (GST), glutathione (Sigma-Aldrich Co., Milwaukee, Wis., USA), and serine (Sigma-Aldrich Co., Milwaukee, Wis., USA). Glutathione S-transferases are a family of multifunctional enzymes present in virtually all organisms whose primary activity is to catalyze the conjugation of glutathione (GSH, γ-L-glutamyl-L-cysteinyl-L-glycine) to a number of substrates and therefore, exhibit binding to GSH. The GST was expressed in *E. coli* and purified via glutathione-affinity chromatography. The GST was washed and concentrated in D$_2$O using an Amicon® ultra-4 centrifugal filter unit (Millipore Corp., Billerica, Mass., USA).

The Carr-Purcell Meiboom-Gill (CPMG) based relaxation-edited difference experiment was performed using a sample of GSH (10 mM) and serine (10 mM) and a sample of GSH (10 mM) and serine (10 mM) with 6.25 g/L GST. Both samples were prepared in a 0.2 M PO$_4$ buffer (pH 6.6). A CPMG pulse sequence was used (d1–90$_x$–($\tau$–180$_y$–$\tau$)$_n$–acquire) with composite pulses, d1=2 s (equilibrium delay), $\tau$=4 ms, n=50 for a total spin-lock time of 400 ms, an acquisition time of 1.5 s, and 512 scans. The composite 90$_x$ pulse consisted of 90$_y$-90$_x$-90$_y$-90$_x$ and the 180$_y$ pulse of 90$_x$-180$_y$-90$_x$.

Figure 8:
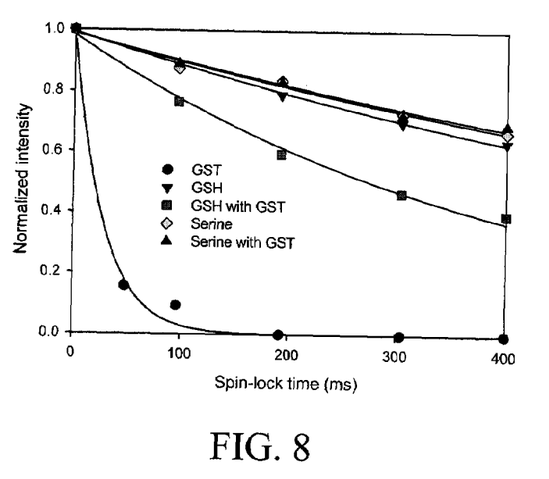
FIG. 8 is a graph of normalized decay curves in a protein-ligand binding study performed with the probe of FIG. 6.

One promising application of the saddle coil difference probe is in the area of bioanalytical NMR. In particular, protein-ligand studies are important for drug development activities. A CPMG experiment was used to demonstrate how a difference experiment traditionally performed on two separate samples could be performed with the saddle coil difference probe in one step. This relaxation-edited experiment is used to reveal ligand-protein interactions by comparing a reference sample of ligands to a sample of the ligands in the presence of the target protein. If a ligand binds to the protein, the effective transverse relaxation rate is increased; otherwise, the ligand relaxation rate is not affected. FIG. 8 shows the effective T$_2$ decay curves for GSH and serine with and without GST and the decay curve of GST itself. The curves were fit with an exponential curve to determine the effective T$_2$ time for each component. The protein displays a typically short effective T$_2$ value of 0.04 s while the free GSH and serine have values of 0.87 s and 1.00 s, respectively. However, in the presence of GST, GSH shows a suppressed relaxation time of 0.41 s while serine is about the same at 1.03 s, indicating that the GSH is binding to the protein. A spin-lock time of 400 ms was chosen to ensure that the protein signal would not interfere with the difference experiment and to provide a large difference between the free and bound ligands signal intensities. Improving the sensitivity of the difference probe would allow us to access lower ligand protein ratios, which would magnify the changes in apparent T$_2$ values and allow a shorter spin-lock time to be used.

Figure 9:
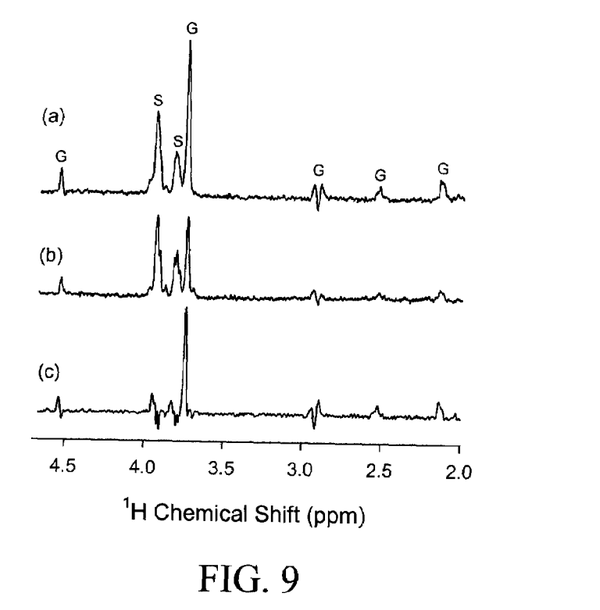
FIG. 9 illustrates spectra obtained during a a protein-ligand binding study.

FIG. 9a shows a spectrum of the ligand sample after a spin-lock time of 400 ms. Some of the GSH peaks are affected by J-coupling modulation, but the peak at 3.74 ppm is a singlet and can be used in this experiment. The J-coupling for serine is small enough that both peaks can be used. FIG. 9b shows a spectrum taken of the ligand-protein mixture with the same spin-lock time. Notice that the GSH (3.74 ppm) is attenuated while the serine signals remain the same, indicating binding of GSH to GST. Traditionally, spectra (a) and (b) would be transferred to a software program where the spectra would be subtracted either manually or using an automated program, which is unnecessary using the difference probe. In FIG. 9c, the CPMG experiment with a spin-lock time of 400 ms was used to produce a difference spectrum of the two samples with the saddle coil difference probe with both samples inside the probe at the same time. The serine peaks in FIG. 9c show the characteristic dispersion pattern of subtracted peaks while the GSH (3.74 ppm) is clearly visible, indicating binding to the protein. The linewidth in FIG. 9c for GSH is 5.1 Hz, which is broad for typical spectra obtain with the difference probe. One reason for the broad lines is the fact that there is no lock circuit to compensate for drift during this relatively long experiment. In addition, the sample was not spun during the CPMG experiment, so transverse field inhomogeneities were not suppressed.

A new difference probe was developed with saddle-shaped coils that allow for vertically aligned, spinning samples. A 3 mm NMR tube was modified by using Ultem magnetic susceptibility matched plastic to separate two samples within the tube. The dual saddle difference probe has a resonant circuit that uses crossed-diode switches to create a phase difference between the two samples' signals, thus, creating a difference spectrum automatically through the hardware. One advantage of the difference probe is that two samples can be analyzed simultaneously, thus decreasing the overall analysis time compared to a probe with the same sensitivity. Because the difference between the signals is completed in the hardware of the probe circuit before reaching the receiver of the spectrometer, the effective dynamic range of the probe is increased as large signals can be suppressed prior to acquisition.

While the invention has been illustrated and described in detail in the drawings and foregoing description, the same is to be considered as illustrative and not restrictive in character, it being understood that only preferred embodiments has been shown and described and that all changes and modifications that come within the spirit of the invention are desired to be protected. For example, the use of small nonmagnetic diode dies may also prove to be useful in a variety of NMR probe related circuits including radio frequency switching and Q-spoiling applications.

We claim:

1. A multi-coil NMR difference probe, comprising:
a pair of sample holders adapted to be positioned within an NMR magnet;
first and second sample coils positioned around said sample holders, said sample coils having directly interconnected first ends, said first sample coil having a second end connected to a receiver, said second sample coil having a second end connected to ground; and
first and second nonmagnetic crossed-diode pairs located proximate said sample coils within said probe, said first crossed-diode pair connected between a transmitter and said interconnected first ends of said sample coils, said second crossed-diode pair connected between said second ends of said sample coils.

2. The NMR probe of claim 1, wherein said nonmagnetic crossed-diode pairs each comprise diode dice mounted on a ceramic substrate and wire bonded with nonmagnetic wire to a pad on said substrate.

3. The NMR probe of claim 2, wherein said pad is a gold pad and said wire is aluminum or gold wire.

4. A multi-coil NMR probe, comprising:
a plurality of sample holders adapted to be positioned within an NMR magnet;
a plurality of sample coils respectively positioned around said sample holders; and
a diode switching circuit connected to said sample coils, said switching circuit including a plurality of nonmagnetic diodes located proximate said sample coils within said probe.

5. The NMR probe of claim 4, wherein said nonmagnetic diodes each comprise a diode die mounted on a ceramic substrate and wire bonded with nonmagnetic wire to a pad on said substrate.

6. The NMR probe of claim 5, wherein said pad is a gold pad.

7. The NMR probe of claim 6, wherein each diode die is wire bonded to said gold pad with aluminum or gold wire.

8. The NMR probe of claim 7, wherein each diode die is encapsulated with said gold pad and wire bonding in a nonmagnetic polymer.

9. The NMR probe of claim 4, wherein said switching circuit comprises a linear array of resonant circuits connected in parallel, and a plurality of switches each including at least one diode and means for supplying a DC switching control current to said at least one diode.

10. The NMR probe of claim 4, wherein said switching circuit comprises a diode crossbar array, said array having a plurality of row selection switches and a plurality of column selection switches.

* * * * *